(12) United States Patent
Lu et al.

(10) Patent No.: US 11,955,416 B2
(45) Date of Patent: Apr. 9, 2024

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventors: Cheng-Hsien Lu, Taoyuan (TW); Yun-Yuan Wang, Kaohsiung (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 177 days.

(21) Appl. No.: 17/475,439

(22) Filed: Sep. 15, 2021

(65) Prior Publication Data

US 2023/0079160 A1 Mar. 16, 2023

(51) Int. Cl.
*H01L 23/498* (2006.01)
*H01L 21/48* (2006.01)

(52) U.S. Cl.
CPC ...... *H01L 23/49827* (2013.01); *H01L 21/486* (2013.01); *H01L 23/49866* (2013.01); *H01L 23/49877* (2013.01)

(58) Field of Classification Search
CPC ............ H01L 23/49827; H01L 21/486; H01L 23/49866; H01L 23/49877; H01L 21/76843; H01L 21/76885; H01L 21/76898; H01L 23/481
See application file for complete search history.

(56) References Cited

U.S. PATENT DOCUMENTS

| 8,236,584 | B1 * | 8/2012 | Chem ................ H01L 24/97 257/784 |
| 9,105,696 | B1 * | 8/2015 | Dow ................ H01L 21/0206 |
| 10,141,412 | B2 | 11/2018 | Wu et al. |
| 2011/0241061 | A1 * | 10/2011 | Yu ................ H01L 21/76876 257/E33.056 |
| 2014/0145332 | A1 * | 5/2014 | Ryan ................ H01L 21/76849 438/653 |
| 2014/0167268 | A1 * | 6/2014 | Bao ................ H01L 23/53276 257/761 |
| 2015/0001723 | A1 * | 1/2015 | Chien ................ H01L 21/76826 257/751 |
| 2015/0137377 | A1 * | 5/2015 | Bao ................ H01L 21/76849 257/758 |
| 2015/0255364 | A1 * | 9/2015 | Gao ................ H01L 23/481 438/653 |
| 2016/0064280 | A1 * | 3/2016 | Ookita ................ H01L 23/485 252/512 |
| 2017/0221796 | A1 * | 8/2017 | Lin ................ H01L 21/76831 |
| 2018/0033727 | A1 * | 2/2018 | Lee ................ H01L 21/76844 |

(Continued)

FOREIGN PATENT DOCUMENTS

TW 201828474 A 8/2018
TW 201839180 A 11/2018

*Primary Examiner* — Tony Tran
(74) *Attorney, Agent, or Firm* — McClure, Qualey & Rodack, LLP

(57) ABSTRACT

A semiconductor structure is provided. The semiconductor structure comprises a substrate, a via, a liner layer, a barrier layer, and a conductor. The via penetrates through the substrate. The liner layer is formed on a sidewall of the via. The barrier layer is formed on the liner layer. The barrier layer comprises a conductive 2D material. The conductor fills a remaining space of the via.

10 Claims, 7 Drawing Sheets

(56) References Cited

U.S. PATENT DOCUMENTS

| | | | |
|---|---|---|---|
| 2020/0235055 A1* | 7/2020 | Hegde | H01L 21/76858 |
| 2021/0090999 A1* | 3/2021 | Yoo | H01L 23/5226 |
| 2022/0139775 A1* | 5/2022 | Naylor | H01L 21/76856 |
| | | | 438/625 |
| 2022/0157710 A1* | 5/2022 | Li | H01L 21/76831 |
| 2022/0359381 A1* | 11/2022 | Li | H01L 23/5226 |
| 2022/0384197 A1* | 12/2022 | Deijkers | C23C 16/45536 |

* cited by examiner

SEMICONDUCTOR STRUCTURE AND METHOD FOR MANUFACTURING THE SAME

TECHNICAL FIELD

This disclosure relates to a semiconductor structure and a method for manufacturing the same. More particularly, this disclosure relates to a semiconductor structure comprising a TSV structure and a method for manufacturing the same.

BACKGROUND

In 2.5D and 3D integrations, TSV (through silicon via) is widely used for signal and/or power transmission. Typically, the transmission is conducted by a conductor filled into the via, such as Cu. However, as the signal frequency increases, the transmission efficiency may decrease significantly due to skin effect. When the frequency increases, the conductive area through which a current pass decreases, and the current will more concentrate on a surface of the conductor. As such, the resistance of the conductor increases, and the transmission efficiency of the TSV structure is deteriorated.

SUMMARY

The disclosure is directed to provide a TSV structure which is suitable for the high frequency transmission.

According to some embodiments, a semiconductor structure is provided. The semiconductor structure comprises a substrate, a via, a liner layer, a barrier layer, and a conductor. The via penetrates through the substrate. The liner layer is formed on a sidewall of the via. The barrier layer is formed on the liner layer. The barrier layer comprises a conductive 2D material. The conductor fills a remaining space of the via.

According to some embodiments, a method for manufacturing a semiconductor structure is provided. The method comprises following steps. First, a via is formed through a substrate. Then, a liner layer is formed on a sidewall of the via. A barrier layer is formed on the liner layer using a conductive 2D material, A conductor is formed in a remaining space of the via.

Figure 1:
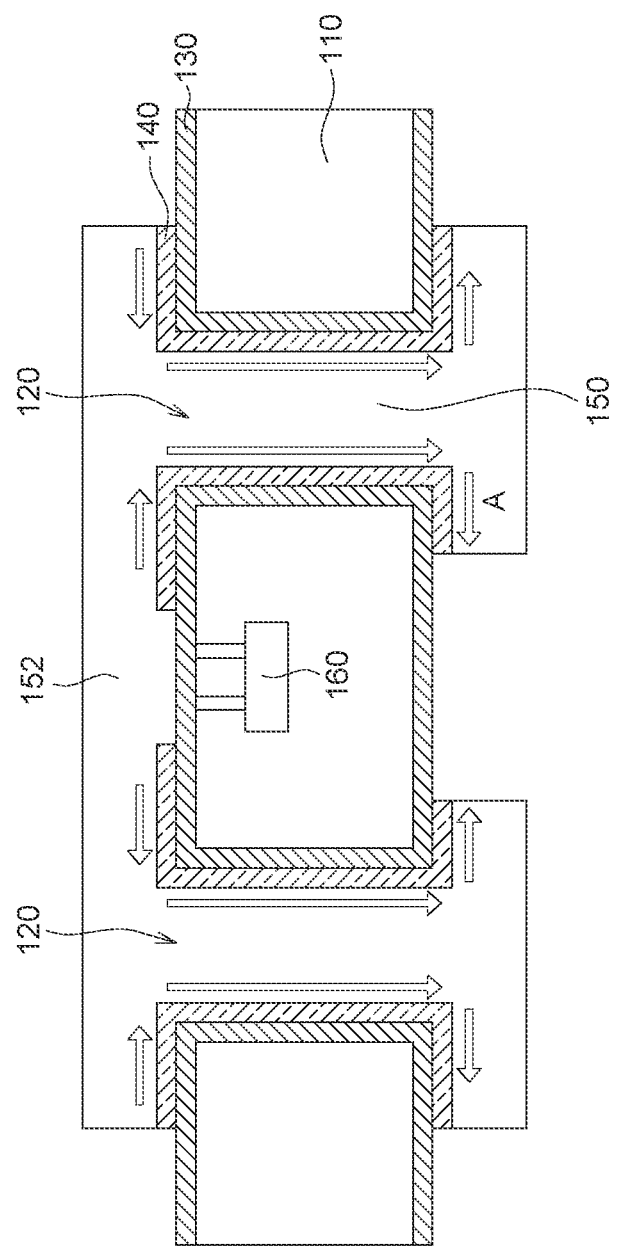
FIG. 1 illustrates an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The following description and the accompanying drawings are provided for illustrative only, and not intended to result in a limitation. For clarity, the components may not be drawn to scale. In addition, some components and/or reference numerals may be omitted from some drawings. It is contemplated that the elements and features of one embodiment can be beneficially incorporated in another embodiment without further recitation.

Referring to FIG. 1, an exemplary semiconductor structure 100 according to embodiments is shown. The semiconductor structure 100 comprises a substrate 110, a via 120, a liner layer 130, a barrier layer 140, and a conductor 150. The via 120 penetrates through the substrate 110. The liner layer 130 is formed on a sidewall of the via 120. The barrier layer 140 is formed on the liner layer 130. The barrier layer 140 comprises a conductive 2D material. The conductor 150 fills a remaining space of the via 120.

More specifically, the substrate 110 may have a main body comprising silicon. In addition to the main body, the substrate 110 may further include an electronic device 160 and other components (not shown) therein and/or thereon. Further details of which will be omitted herein so as not to obscure the disclosure.

While only one via 120 is shown in FIG. 1, It is contemplated that the number of the vias through the substrate 110 can be decided according to design, and the structure described herein may be applied to one or more of the vias.

The liner layer 130 may comprise $SiO_2$ or any other suitable dielectric material. As shown in FIG. 1, the liner layer 130 may further extend to a top surface and/or a bottom surface of the substrate 110. Further details of which will be omitted herein so as not to obscure the disclosure.

The barrier layer 140 comprises a conductive 2D material. The barrier layer 140 can be completely formed of a conductive 2D material that can prevent metal of the conductor 150 form diffusing into the substrate 113. For example, the conductive 2D material may be graphene. Surprisingly, single-layered graphene may exhibit even better barrier effect that TaN, which is a material typically used for the barrier layers in conventional TSV structures. For another example, the conductive 2D material may be a transition metal dichalcogenide, such as $VSe_2$, $PtTe_2$, $VS_2$, $PtSe_2$, or the like. In some embodiments, two or more of said materials may be used. A resistivity of the conductive 2D material is equal to or lower than $0.25\Omega\cdot\mu m$. A thickness of the barrier layer 140 may be adjusted accordingly. In some embodiments, the conductive 2D material is graphene, and a thickness of the barrier layer 140 is 0.35 nm to 50 nm, such as 0.4 nm to 50 nm. For example, when a thickness of graphene is about 0.35 nm to about 10 nm, resistivity thereof may be about $0.02\Omega\cdot\mu m$ to about $0.25\Omega\cdot\mu m$. It is noted that, in such scale, conductivity of graphene reduces as the thickness increases due to inhibited carrier mobility. In some embodiments, the conductive 2D material is a transition metal dichalcogenide, and a thickness of the barrier layer 140 is 5 nm to 200 nm, such as 8 nm to 200 nm. For example, when a thickness of $PtSe_2$ is 8 nm, resistivity thereof may be about $625\Omega\cdot\mu m$. The transition metal dichalcogenide may transform from semimetal to semiconductor when the thickness further decreases. This will lead to a significant decrease of the conductivity. As shown in FIG. 1, the barrier layer 140 may further extend to a top surface and/or a bottom surface of the substrate 110.

The conductor 150 may comprise Cu or any other suitable material. As shown in FIG. 1, the conductor 150 may further extend to a top surface and/or a bottom surface of the substrate 110. The conductor 150 may form an interconnect 152, so as to provide an electrical coupling between the electronic device 160 and the TSV structure. Further details of which will be omitted herein so as not to obscure the disclosure.

In this disclosure, a barrier layer formed using a conductive 2D material replaces the Ta or TaN barrier layer of a conventional TSV structure. Since the barrier layer is also conductive, it can complement the disadvantage caused by skin effect of the conductor. As such, the resistance of the TSV structure decreases, and it is suitable for the high frequency transmission. Also, as size of a TSV structure shrinks, the ratio of the area occupied by the barrier layer increases, and thus the barrier layer effect becomes more critical. In addition, since 2D materials have less or even no dangling bonds, the conductive 2D material can provide a partially elastic surface to the conductor, and the electron surface scattering will be lower than that in a conventional TSV structure. This provides a higher transmission efficiency.

Now the description is directed to a method for manufacturing the semiconductor structure according to embodiments. The method comprises following steps. First, a via is formed through a substrate. Then, a liner layer is formed on a sidewall of the via. A barrier layer is formed on the liner layer using a conductive 2D material. A conductor is formed in a remaining space of the via.

Referring to FIGS. 2A-2I, an exemplary method for manufacturing a semiconductor structure according to embodiments is shown. A blind via process is applied in the method illustrated in FIGS. 2A-2I to form a TSV structure.

Figure 2A:
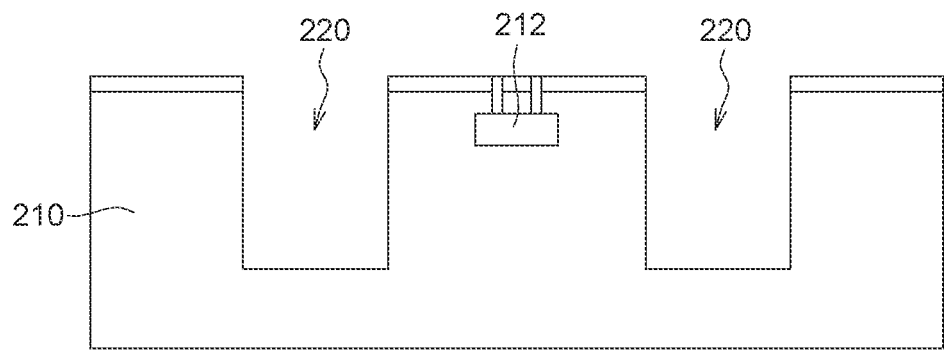
FIGS. 2A-2I illustrate various stages of an exemplary method for manufacturing a semiconductor structure according to embodiments.

Before the stage shown in FIG. 2A, a substrate 210 may have been treated, such as with a conventional CMOS process stopping at a chemical mechanical planarization (CMP) process of first level metal or W plug, but the disclosure is not limited thereto. For example, an electronic device 212 as shown in FIG. 2A is formed in the substrate 210 before the stage of FIG. 2A.

As shown in FIG. 2A, a via 220 is formed through the substrate 210. The via 220 may be fabricated by a Bosch process, but the disclosure is not limited thereto.

Figure 2B:
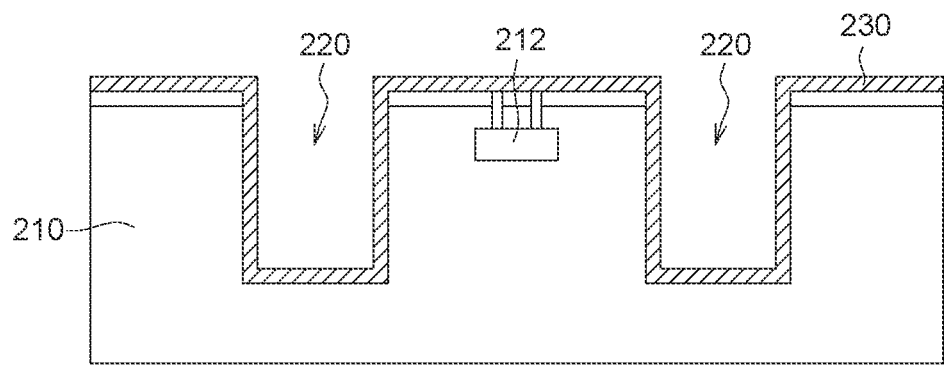

As shown in FIG. 2B, a liner layer 230 is formed on a sidewall of the via 220. The material used to form the liner layer 230 may be $SiO_2$ or any other suitable dielectric material. The liner layer 230 may be formed by a chemical vapor deposition (CVD) process, but the disclosure is not limited thereto. The liner layer 230 as formed may further extend to a top surface of the substrate 210. The liner layer 230 may be formed in a conformal manner.

Figure 2C:
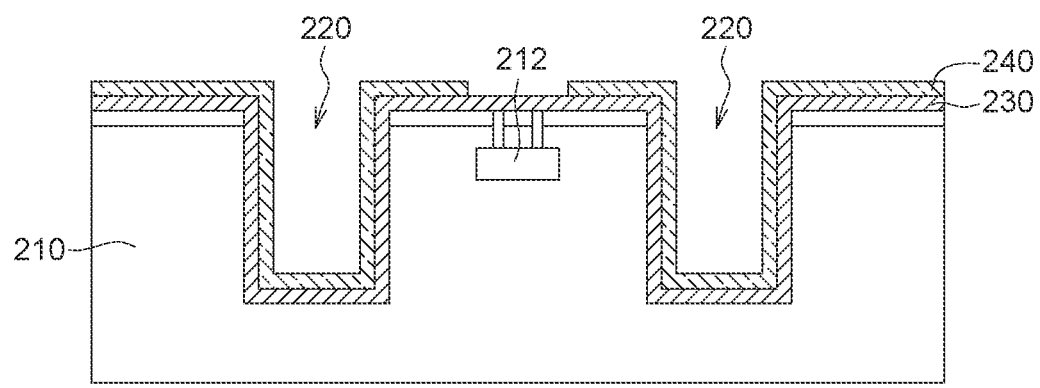

As shown in FIG. 2C, a barrier layer 240 is formed on the liner layer 230 using a conductive 2D material. The conductive 2D material used to form the barrier layer 240 may have a resistivity equal to or lower than 0.25Ω·μm. The conductive 2D material used to form the barrier layer 240 may comprise at least one of graphene, $VSe_2$, $PtTe_2$, $VS_2$, or $PtSe_2$. In some embodiments, the conductive 2D material used to form the barrier layer 240 is graphene, and the barrier layer 240 is formed to have a thickness of, for example, 0.35 nm to 50 nm. In some embodiments, the conductive 2D material used to form the barrier layer 240 is $VSe_2$, $PtTe_2$, $VS_2$, or $PtSe_2$, and the barrier layer 240 is formed to have a thickness of, for example, 5 nm to 200 nm. The barrier layer 240 may be formed by a CVD process, but the disclosure is not limited thereto. The barrier layer 240 as formed may further extend to a top surface of the substrate 210. The barrier layer 240 may be formed in a conformal manner.

Figure 2D:
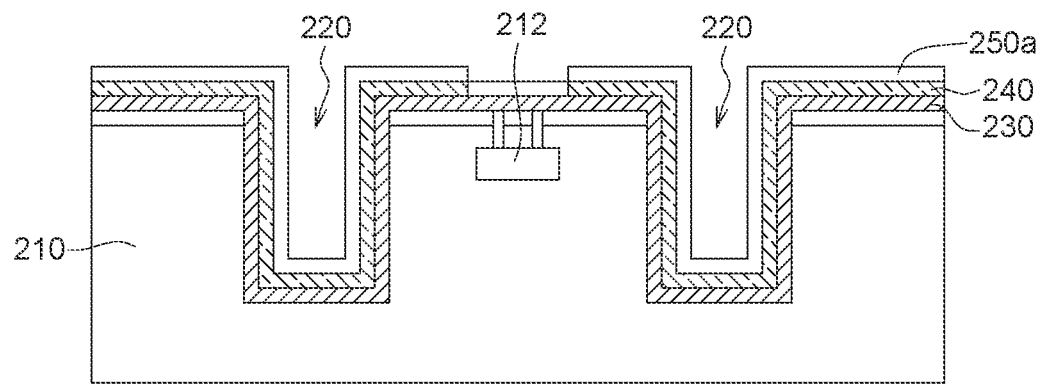
Figure 2E:
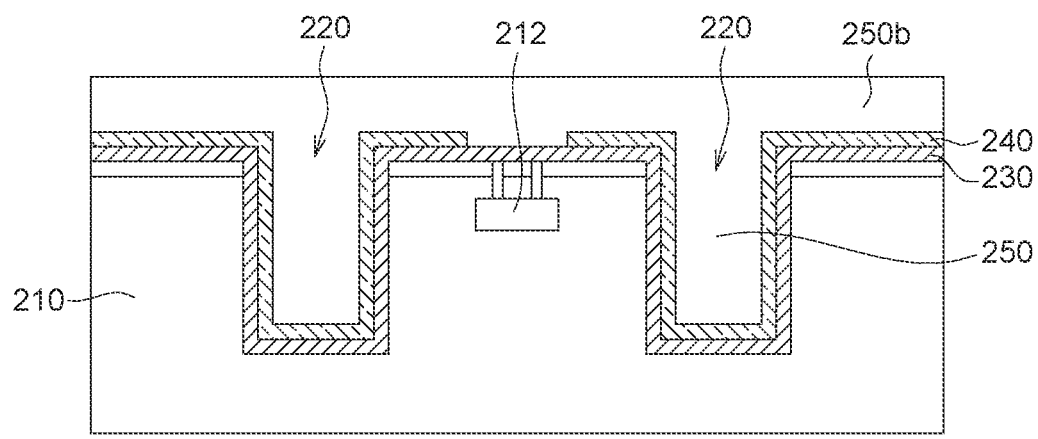

A conductor 250 is formed in a remaining space of the via 220 with the processes of FIG. 2D and FIG. 2E. As shown in FIG. 2D, a seed layer 250a may be formed on the barrier layer 240. A material used to form the seed layer 250a may be Cu. The seed layer 250a may be formed by a sputtering process. The seed layer 250a may be formed in a conformal manner.

Then, as shown in FIG. 2E, a conductive material 250b is provided onto the seed layer 250a. The conductive material 250b may be Cu. The conductive material 250b may be provided by an electroplating process and a CMP process. By these two steps, the conductor 250 is formed. The conductor 250 as formed may further extend to a top surface of the substrate 210 and forms an interconnect to the electronic device 212.

Figure 2F:
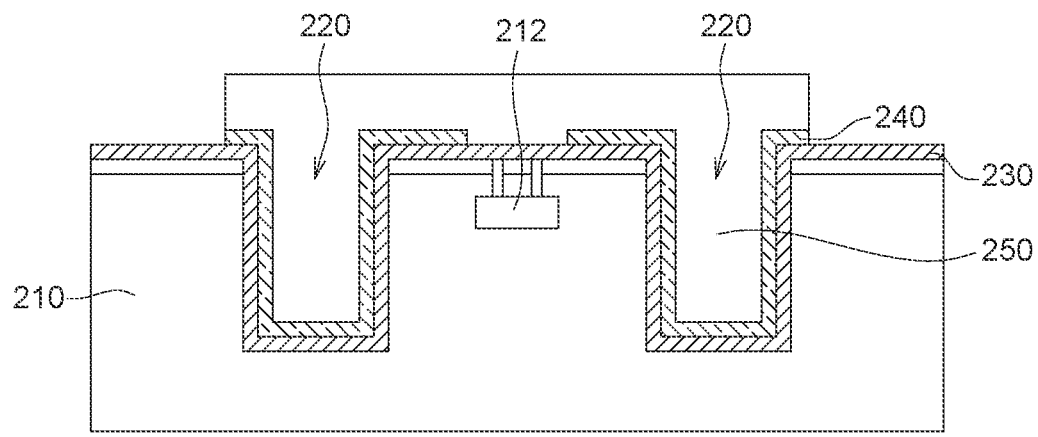

As shown in FIG. 2F, the barrier layer 240 and the conductor 250 are patterned. As such, a frontside interconnect can be defined from the conductor 250. The barrier layer 240 and the conductor 250 may be patterned by an etching process.

Figure 2G:
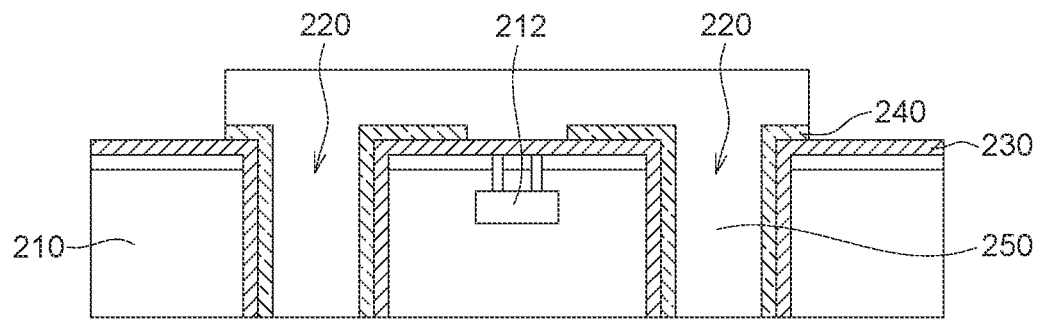

As shown in FIG. 2G, a backside grinding process is conducted to expose the via 220 from a backside of the substrate 210.

Figure 2H:
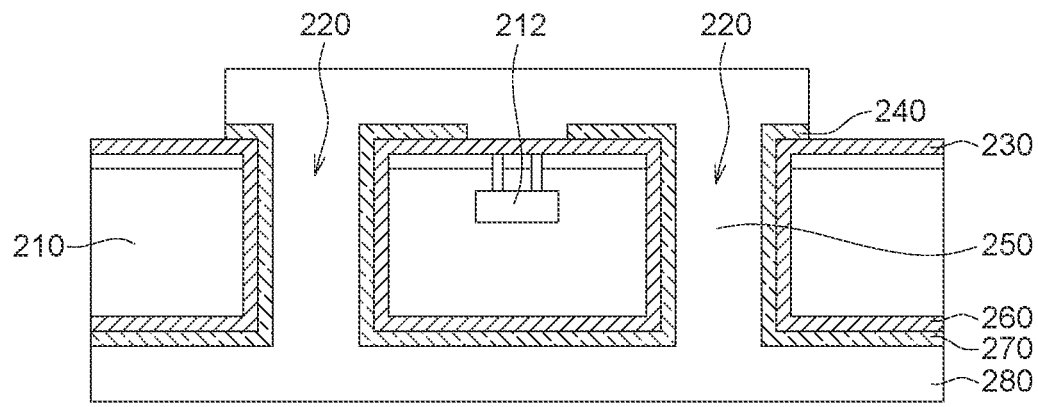

As shown in FIG. 2H, a second liner layer 260, a second barrier layer 270, and a second conductor 280 are sequentially formed on a lower surface of the substrate 210. They can be formed similar to the liner layer 230, the barrier layer 240, and the conductor 250.

Figure 2I:
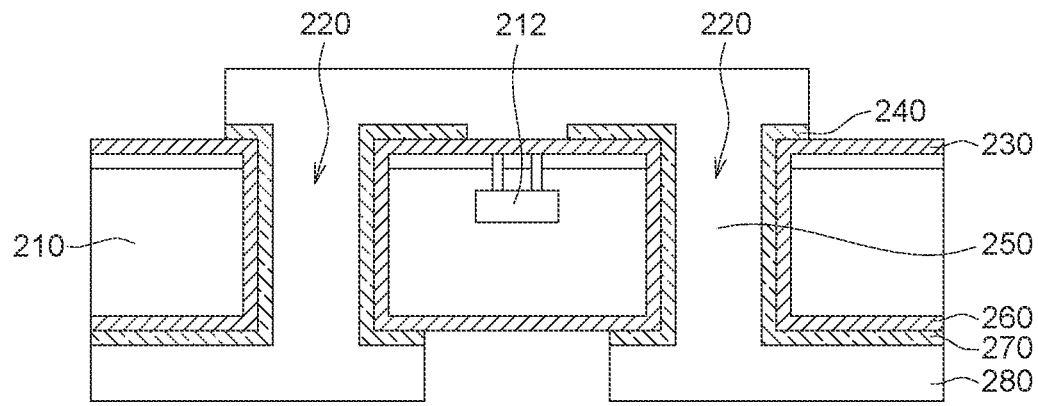

As shown in FIG. 2I, the second barrier layer 270 and the second conductor 280 are patterned. As such, a backside interconnect can be defined from the second conductor 280. The second barrier layer 270 and the second conductor 280 may be patterned by an etching process. In the structure shown in FIG. 2I, a combination of the liner layer 230 and the second liner layer 260 is equivalent to the liner layer 130 of FIG. 1, a combination of the barrier layer 240 and the second barrier layer 270 is equivalent to the barrier layer 140 of FIG. 1, and a combination of the conductor 250 and the second conductor 280 is equivalent to the conductor 150 of FIG. 1.

Referring to FIGS. 3A-3F, another exemplary method for manufacturing a semiconductor structure according to embodiments is shown. A through via process is applied in the method illustrated in FIGS. 3A-3F to form a TSV structure.

Figure 3A:
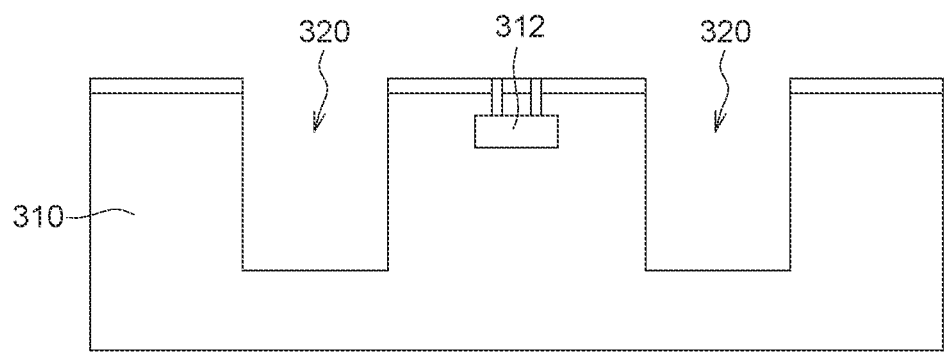
FIGS. 3A-3F illustrate various stages of another exemplary method for manufacturing a semiconductor structure according to embodiments.

Before the stage shown in FIG. 3A, a substrate 310 may have been treated, such as with a conventional CMOS process stopping at a chemical mechanical planarization (CMP) process of first level metal or W plug, but the disclosure is not limited thereto. For example, an electronic device 312 as shown in FIG. 3A is formed in the substrate 310 before the stage of FIG. 3A.

As shown in FIG. 3A, a via 320 is formed through the substrate 310. The via 320 may be fabricated by a Bosch process, but the disclosure is not limited thereto.

Figure 3B:
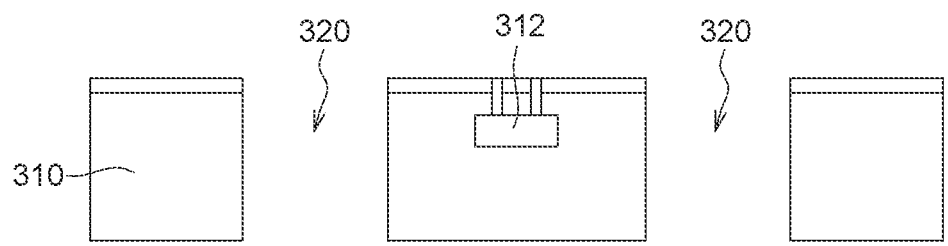

As shown in FIG. 3B, a backside grinding process is conducted to expose the via 320 from a backside of the substrate 310.

Figure 3C:
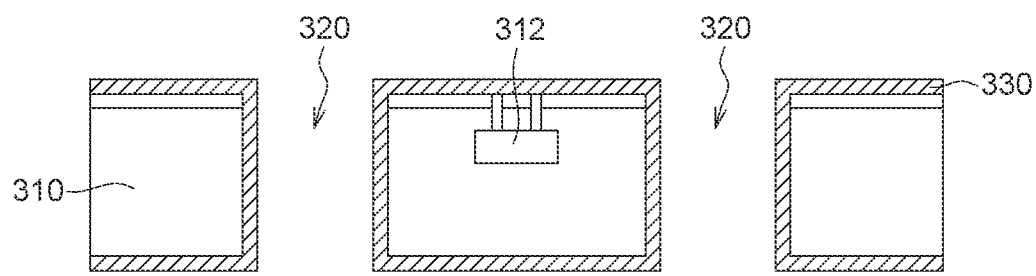

As shown in FIG. 3C, a liner layer 330 is formed on a sidewall of the via 320. The material used to form the liner layer 330 may be $SiO_2$ or any other suitable dielectric material. The liner layer 330 may be formed by a CVD process, but the disclosure is not limited thereto. The liner layer 330 as formed may further extend to a top surface and/or a bottom surface of the substrate 310. The liner layer 330 may be formed in a conformal manner.

Figure 3D:
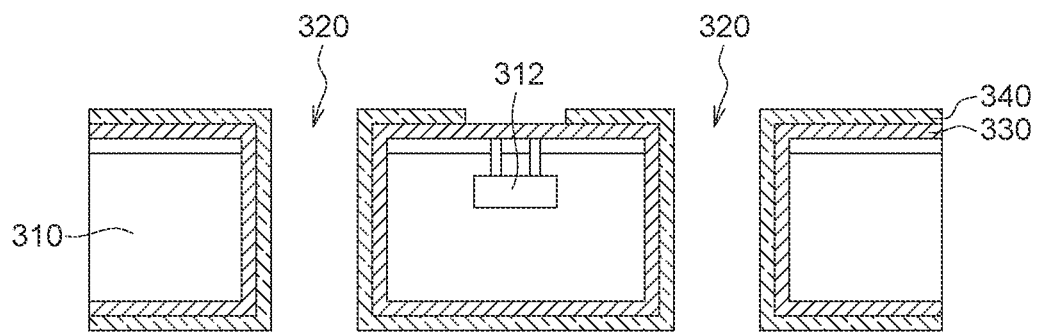

As shown in FIG. 3D, a barrier layer 340 is formed on the liner layer 330 using a conductive 2D material. The conductive 2D material used to form the barrier layer 340 may have a resistivity equal to or lower than 0.25Ω·μm. The conductive 2D material used to form the barrier layer 340 may comprise at least one of graphene, $VSe_2$, $PtTe_2$, $VS_2$, or $PtSe_2$. In some embodiments, the conductive 2D material used to form the barrier layer 340 is graphene, and the barrier layer 340 is formed to have a thickness of, for example, 0.35 nm to 50 nm. In some embodiments, the conductive 2D material used to form the barrier layer 340 is $VSe_2$, $PtTe_2$, $VS_2$, or $PtSe_2$, and the barrier layer 340 is formed to have a thickness of, for example, 5 nm to 200 nm. The barrier layer 340 may be formed by a CVD process, but the disclosure is not limited thereto. The barrier layer 340 as formed may further extend to a top surface and/or a bottom surface of the substrate 310. The barrier layer 340 may be formed in a conformal manner.

Figure 3E:
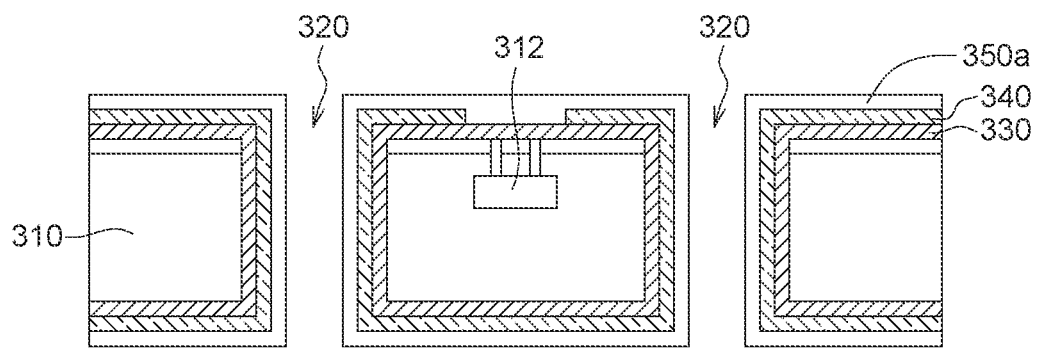
Figure 3F:
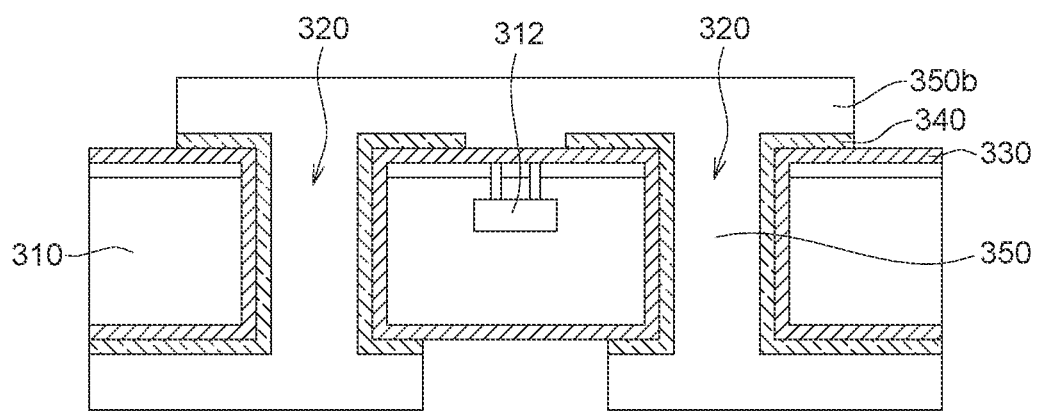

A conductor 350 is formed in a remaining space of the via 320 with the processes of FIG. 3E and FIG. 3F. As shown in FIG. 3E, a seed layer 350a may be formed on the barrier layer 340. A material used to form the seed layer 350a may be Cu. The seed layer 350a may be formed by a sputtering process. The seed layer 350a may be formed in a conformal manner.

Then, as shown in FIG. 3F, a conductive material 350b is provided onto the seed layer 350a. The conductive material 350b may be Cu. The conductive material 350b may be provided by an electroplating process and a CMP process. As such, the conductor 350 is formed. The conductor 350 as formed may further extend to a top surface and/or a bottom surface of the substrate 310 and forms an interconnect to the electronic device 312. Then, the barrier layer 340 and the conductor 350 may be patterned. As such, a frontside interconnect and/or a backside interconnect can be defined from the conductor 350. The barrier layer 340 and the conductor 350 may be patterned by an etching process.

While the method for manufacturing the semiconductor structure has been illustrated above with accompanying drawings, it is contemplated that the method of the disclosure can be combined with any TSV manufacturing process. For example, the concept of the disclosure can be applied in a via first process, a via middle process (such as the case of FIGS. 2A-2I), or a via last process (such as the case of FIGS. 3A-3F).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:
    forming a via through a substrate from a top surface to a bottom surface of the substrate;
    forming a liner layer on a sidewall of the via;
    forming a barrier layer on the liner layer using a conductive 2D material; and
    forming a conductor in a remaining space of the via;
wherein after forming the conductor, the method further comprises:
    patterning the barrier layer and the conductor;
    conducting a backside grinding process to expose the via from a backside of the substrate;
    sequentially forming a second liner layer, a second barrier layer, and a second conductor on the bottom surface of the substrate; and
    patterning the second barrier layer and the second conductor.

2. The method according to claim 1, wherein in forming the barrier layer, the conductive 2D material used to form the barrier layer has a resistivity equal to or lower than 0.25Ω·μm.

3. The method according to claim 1, wherein in forming the barrier layer, the conductive 2D material used to form the barrier layer comprises at least one of graphene, $VSe_2$, $PtTe_2$, $VS_2$, or $PtSe_2$.

4. The method according to claim 1, wherein in forming the barrier layer, the conductive 2D material used to form the barrier layer is graphene, and the barrier layer is formed to have a thickness of 0.35 nm to 50 nm.

5. The method according to claim 1, wherein in forming the barrier layer, the conductive 2D material used to form the barrier layer is $VSe_2$, $PtTe_2$, $VS_2$, or $PtSe_2$, and the barrier layer is formed to have a thickness of 5 nm to 200 nm.

6. The method according to claim 1, further comprising:
    forming an electronic device in the substrate.

7. The method according to claim 6, wherein the conductor further extends to the top surface and/or the bottom surface of the substrate and forms an interconnect to the electronic device.

8. The method according to claim 1, wherein the liner layer and the barrier layer further extend to the top surface and/or the bottom surface of the substrate.

9. The method according to claim 1, wherein forming the conductor comprises:
    forming a seed layer on the barrier layer; and
    providing a conductive material onto the seed layer.

10. A method for manufacturing a semiconductor structure, comprising:
    forming a via through a substrate from a top surface to a bottom surface of the substrate;
    forming a liner layer on a sidewall of the via;
    forming a barrier layer on the liner layer using a conductive 2D material; and
    forming a conductor in a remaining space of the via;
wherein before forming the liner layer, the method further comprises:
    conducting a backside grinding process to expose the via from a backside of the substrate;
and
wherein after forming the conductor, the method further comprises:
    patterning the barrier layer and the conductor.

* * * * *